United States Patent [19]

Takeshima et al.

[11] Patent Number: 4,972,096

[45] Date of Patent: Nov. 20, 1990

[54] INTEGRATED CIRCUIT HAVING BIPOLAR-CMOS CIRCUIT

[75] Inventors: Tohru Takeshima; Takashi Ozawa, both of Yokohama, Japan

[73] Assignee: Fujitsu Limited, Kawasaki, Japan

[21] Appl. No.: 384,431

[22] Filed: Jul. 25, 1989

[30] Foreign Application Priority Data

Jul. 29, 1988 [JP] Japan .................................. 63-189981

[51] Int. Cl.⁵ ..................... H03K 3/356; H03K 19/01; H03K 19/082; H03K 19/003
[52] U.S. Cl. .................................... 307/279; 307/446; 307/570
[58] Field of Search ............... 307/279, 446, 570, 571, 307/475, 450, 451, 452, 453

[56] References Cited.

U.S. PATENT DOCUMENTS

| | | | |
|---|---|---|---|
| 4,740,718 | 4/1988 | Matsui | 307/446 |
| 4,804,869 | 2/1989 | Masuda et al. | 307/446 |
| 4,845,385 | 7/1989 | Ruth, Jr. | 307/446 |
| 4,890,017 | 12/1989 | Masuda et al. | 307/446 |
| 4,906,868 | 3/1990 | Maki et al. | 307/446 |
| 4,926,069 | 5/1990 | Yamazaki | 307/446 |

Primary Examiner—Stanley D. Miller
Assistant Examiner—David R. Bertelson
Attorney, Agent, or Firm—Staas & Halsey

[57] ABSTRACT

A flip-flop includes two gates each having a CMOS circuit and a bipolar circuit. One bipolar circuit related to one of the gates includes first and second bipolar transistors, and the other bipolar circuit includes third and fourth bipolar transistors. A discharge circuit discharges the base of the first bipolar transistor in response to a change in a second input and discharges the base of the third bipolar transistor in response to a first input. The first and second inputs are complementary inputs. A charge cirucit charges the base of the second bipolar transistor in response to the second input and charges the base of the fourth bipolar transistor in response to the first input.

15 Claims, 9 Drawing Sheets

INTEGRATED CIRCUIT HAVING BIPOLAR-CMOS CIRCUIT

BACKGROUND OF THE INVENTION

The present invention generally relates to an integrated circuit having a bipolar-CMOS circuit, and particularly to a flip-flop circuit having a bipolar-CMOS circuit.

Currently, a flip-flop is widely used in various electronic circuits such as a register and a latch circuit. As is well known, a flip-flop is formed by NAND gates or NOR gates. Generally, a flip-flop made up of NAND gates operates faster than a flip-flop made up of NOR gates.

Referring to FIG. 1, there is shown a conventional flip-flop composed of NAND gates. NAND gates G1 and G2 are supplied with complementary inputs A and B, respectively. Complementary outputs Q and XQ of the NAND gates G1 and G2 are supplied, as inputs, with the NAND gates G2 and G1, respectively.

A NAND gate outputs a low logic level (hereinafter simply referred to as L) when both the inputs are a high logic level (hereinafter simply referred to as H). For example, when A=H and B=L, the flip-flop has a stable state where Q=L and XQ=H. In this state, when the inputs A and B change such that A=L and B=H, the two inputs of the NAND gate G1 are switched to L and H and the output Q thereof is changed from L to H. Thus, both the inputs of the NAND gate G2 change to H, and the output XQ thereof is switched from H to L. In this state, the flip-flop is settled.

It is noted that the output of one of the NAND gates does not change from H to L until the output of the other NAND gate has changed to H. For the above-mentioned example, the output of the NAND gate G2 changes from H to L when the output of the NAND gate G1 has changed to H. That is, there is a delay of time between the outputs Q and XQ. This delay is equal to one stage of NAND gate. The delay occurring between the outputs Q and XQ causes a skew.

The delay between the outputs Q and XQ is described in detail below with reference to FIG. 2, which is a circuit diagram of an example of the structure for the flip-flop shown in FIG.1. The NAND gate G1 includes P-channel metal oxide semiconductor transistors P21 and P22 connected to a high-potential power source $V_{DD}$, and N-channel metal oxide semiconductor transistors N21 and N22. Hereinafter, a P-channel metal oxide semiconductor is simply referred to as PMOS transistor, and an N-channel metal oxide semiconductor is simply referred to as NMOS transistor. The PMOS transistors P21 and P22, and the NMOS transistors N21 and N22 define a NAND logic. An NPN bipolar transistor Q21 is used for charging the output Q quickly, and an NPN bipolar transistor Q23 is used for discharging the output Q quickly. That is, the bipolar transistors Q21 and Q23 function to drive a load coupled to the output of the NAND gate G1. It can be seen from the above description that the NAND gate G1 is a bipolar-CMOS (Bi-CMOS) circuit. NMOS transistors N23 and N24 are used for drawing a charge at the base of the bipolar transistor Q21. An NMOS transistor N25 connected to a low-potential power source (ground for the illustrated example) functions to draw a charge at the base of the bipolar transistor Q23.

The NAND gate G2 is formed in the same manner as the NAND gate G1, and consists of PMOS transistors P23, P24, NMOS transistors N26–N30, and bipolar transistors Q22 and Q24.

It is now assumed that the flip-flop is being settled in the state where A=H, B=L, Q=L, and XQ=H. The ON/OFF state of each of the transistors in this state is illustrated in FIG. 2. When the inputs A and B change from H and L to L and H, respectively, the states of the transistors change as follows. The PMOS transistor P21 changes from OFF to ON, and the NMOS transistors N21 and N23 change from ON to OFF. Thereby, the bipolar transistor Q21 turns ON. A charge passes through the bipolar transistor Q21, and is supplied to the output Q of the NAND gate G1. Thus, the output Q is changed from L to H.

On the other hand, when the input B changes from L to H, the PMOS transistor P24 is switched from ON to OFF, and the bipolar transistor Q22 turns OFF. Further, the NMOS transistors N26 and N28 turn ON. The aforementioned change in the output Q from L to H is transferred to the gates of the NMOS transistors N27 and N29, so that the NMOS transistors N27 and N28 turn ON. A charge at the output XQ passes through the NMOS transistors N26 and N27. Then a part of the charge is applied to the base of the bipolar transistor Q24, and the remaining charge passes through the NMOS transistor N30. The bipolar transistor Q24 is turned ON by the application of part of the charge from the output XQ. Thereby, the charge at the output XQ is allowed to pass through the bipolar transistor Q24, so that the discharge of the output XQ is accelerated. Then the bipolar transistor Q24 turns OFF again when the output XQ is sufficiently discharged. A change in the output XQ from H to L is transferred to the gates of the NMOS transistors N22 and N24, so that they turn OFF. As a result, the flip-flop is settled in the state where Q=H and XQ=L.

It can be seen from the above-mentioned operation that the state of the NAND gate G2 does not change until the state (output) of the NAND gate G1 changes. Thus, the time difference in change between the outputs Q and XQ occurs

SUMMARY OF THE INVENTION

It is a general object of the present invention to provide an integrated circuit having Bi-CMOS circuits in which the aforementioned disadvantages are eliminated.

A more specific object of the present invention is to provide a flip-flop having Bi-CMOS circuits having a reduced delay appearing between the outputs of the flip-flop.

The above objects of the present invention can be achieved by an integrated circuit including first gate means for inputting first and second inputs and generating a first output indicative of a first logic operation result of the first gate means. The first gate means has a first output terminal passing the first output. The first gate means includes first CMOS means for receiving the first and second inputs and generating the first logic operation result, and first bipolar transistor means for generating the first output from the first logic operation result. The first bipolar transistor means includes a first bipolar transistor charging the first output terminal, and a second bipolar transistor discharging the first output terminal. The integrated circuit includes second gate means for inputting third and fourth inputs and generating a second output indicative of a second logic operation result of the second gate means. The second gate means has a second output terminal passing the second output. The second gate means includes second CMOS means for receiving the third and fourth inputs and generating the second logic operation result, and second bipolar transistor means for generating the second output from the second logic operation result, the second bipolar transistor means including a third bipolar transistor charging the second output terminal, and a fourth bipolar transistor discharging the second output terminal. The first and third inputs are complementary inputs. The first output serves as the fourth input, and the second output serves as the second input. The first and second outputs are complementary outputs. The integrated circuit includes discharge means for discharging a base of the first bipolar transistor of the first bipolar transistor means in response to a change in the third input and for discharging a base of the third bipolar transistor of the second bipolar transistor means in response to a change in the first input. The integrated circuit includes charge means for charging a base of the second bipolar transistor of the first bipolar transistor means in response to the change in the third input and for charging a base of the fourth bipolar transistor of the second bipolar transistor means in response to the change in the first input.

Other objects, features and advantages of the present invention will become apparent from the following detained description when read in conjunction with the accompanying drawings.

DESCRIPTION OF THE PREFERRED EMBODIMENTS

Figure 2:
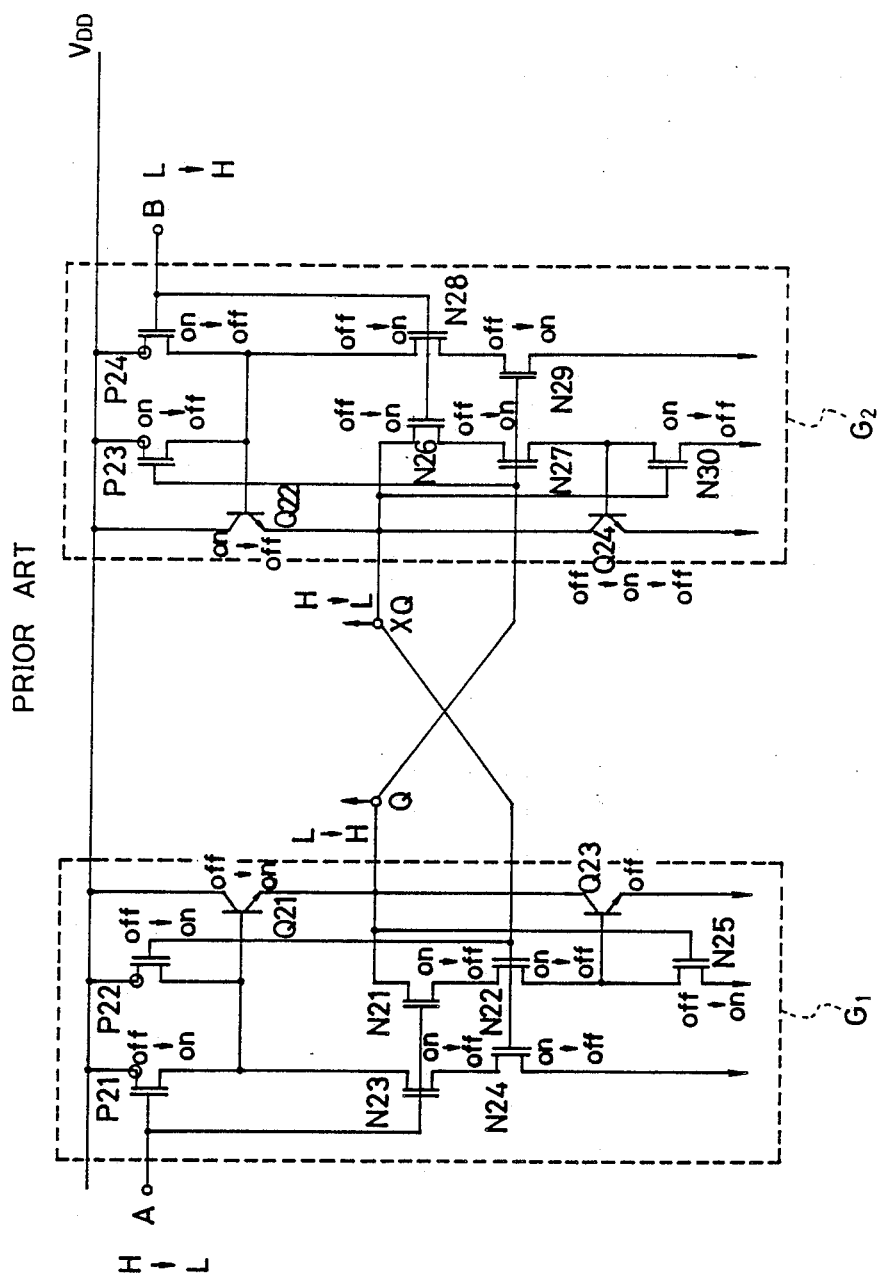
FIG. 2 is a circuit diagram of a configuration for the flip-flop shown in FIG. 1.
Figure 3:
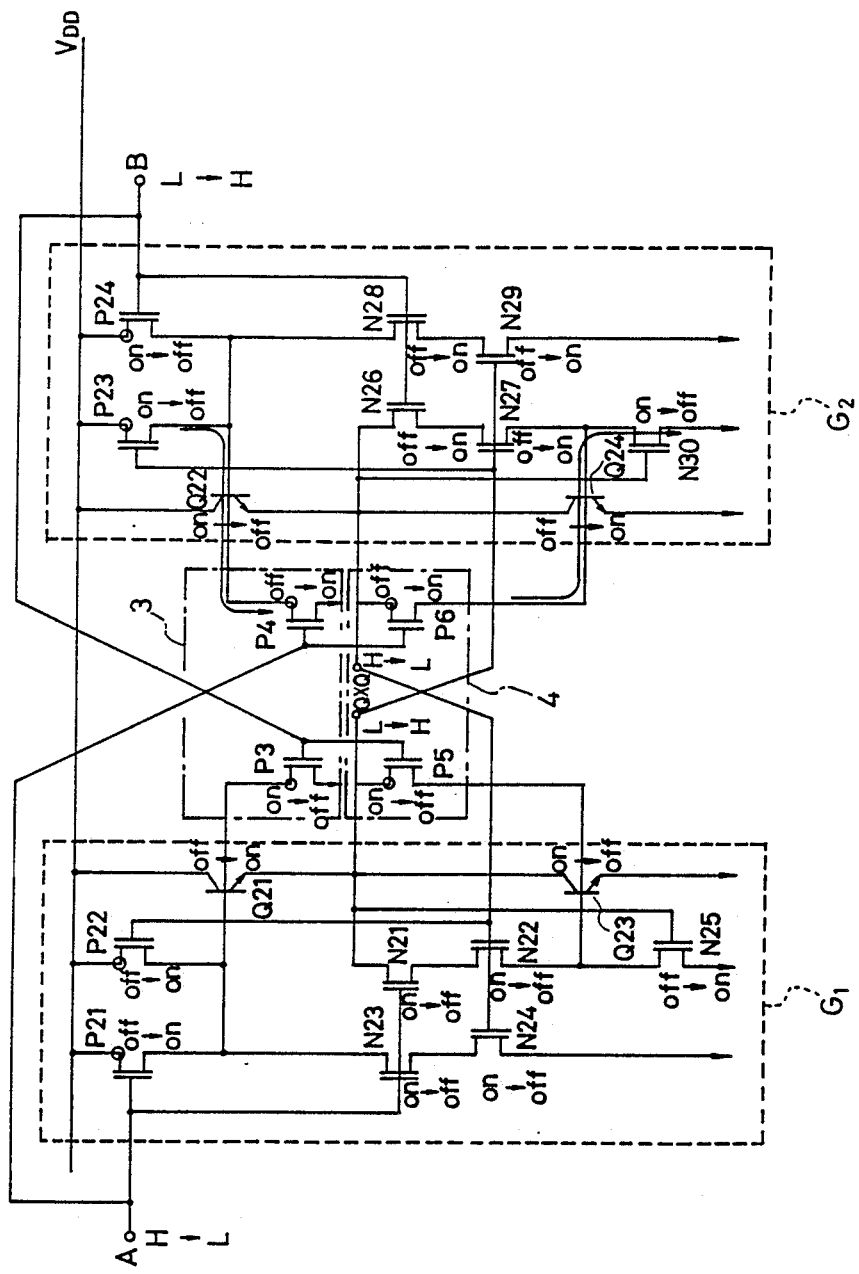
FIG. 3 is a circuit diagram of a first preferable embodiment of the present invention.

A description is given of a first preferred embodiment of the present invention with reference to FIG. 3. In FIG. 3, those parts which are the same as those shown in FIG. 2 are given the same references. An essential feature of the first embodiment is that a base discharge circuit 3 and a base charge circuit 4 are provided for the NAND gates G1 and G2. Each of the base discharge circuit 3 and the base charge circuit 4 is supplied with the complementary inputs A and B. The NAND gates G1 and G2, the base discharge circuit 3, and the base charge circuit 4 form a flip-flop.

The base discharge circuit 3 is made up of PMOS transistors P3 and P4. The gates of the PMOS transistors P3 and P4 are supplied with the inputs B and A, respectively. The source of the PMOS transistor P3 is connected to the base of the bipolar transistor Q21 in the NAND gate G1, and the drain thereof is connected to a low-potential power source (ground). Similarly, the source of the PMOS transistor P4 is connected to the base of the bipolar transistor Q22, and the drain thereof is connected to the low-potential power source. The PMOS transistor P3 functions to discharge the base of the bipolar transistor Q21 in response to a change in the input B. Similarly, the PMOS transistor P4 functions to discharge the base of the bipolar transistor Q22 in response to a change in the input A.

The base charge circuit 4 is made up of PMOS transistors P5 and P6. The gates of the PMOS transistors P5 and P6 are supplied with the inputs B and A, respectively. The source of the PMOS transistor P5 is connected to the collector of the bipolar transistor Q23 and the output Q of the NAND gate G1. The drain of the PMOS transistor P5 is connected to the base of the bipolar transistor Q23. The source of the PMOS transistor P6 is connected to the collector of the transistor Q24 and the output XQ of the NAND gate G2. The drain of the PMOS transistor P6 is connected to the base of the bipolar transistor Q24. The PMOS transistor P5 functions to charge the base of the bipolar transistor Q23 in response to a change in the input A. Similarly, the PMOS transistor P6 functions to charge the base of the bipolar transistor Q24 in response to a change in the input A.

In operation, it is now assumed that the flip-flop shown in FIG. 3 is being settled in the state where A=H, B=L, Q=L and XQ=H. When the inputs A and B change to L and H, respectively, the flip-flop shown in FIG. 3 operates as follows. When the input A changes from H to L, the PMOS transistor P21 turns ON. At the same time, the PMOS transistors P4 and P6 change from OFF to ON. On the other hand, when the input B changes from L to H, the PMOS transistor P24 turns OFF, and simultaneously the PMOS transistors P3 and P5 turn OFF.

Since the PMOS transistor P4 turns ON when the input A changes from H to L, the base of the bipolar transistor Q22 is discharged through the PMOS transistor P4 so that the bipolar transistor Q22 starts turning OFF. At the same time as the PMOS transistor P4 turns ON, the PMOS transistor P6 turns ON. Thus, a charge at the output XQ of the NAND gate G2 is allowed to pass through the PMOS transistor P6. This charge passes through the base of the bipolar transistor Q24 and the NMOS transistor N30, so that the bipolar transistor Q24 starts turning ON. Thus, the charge at the output XQ is allowed to pass through the bipolar transistor Q24, and the level of the output XQ starts decreasing. It is to be noted that the level of the output XQ of the NAND gate G2 starts decreasing when the input A of the NAND gate G1 changes from H to L, or in other words, the level of the output XQ starts decreasing before the level of the output Q of the NAND gate G1 changes. As a result, the flip-flop of the first embodiment can operate at a speed higher than that of the flip-flop shown in FIG. 2. It is noted that the output XQ of the NAND gate G2 starts decreasing after the output Q of the NAND gate G1 changes from L to H in FIG. 2.

When the output XQ is being discharged, the output Q starts changing from L to H in response to a change of the bipolar transistor Q21 from OFF to ON. This change of the output Q is transferred to the NMOS transistors N27 and N29. At this time, the NMOS transistors N26 and N27 have already been turned ON in response to a change in the input B from L to H. Thus, discharging of the output XQ is facilitated through the NMOS transistors N26, N27 and N30.

When the bipolar transistor Q21 turns ON, the NMOS transistor N25 turns ON. Thus, the base of the bipolar transistor Q23 is discharged through the NMOS transistor N25, so that it turns OFF. Therefore, the output Q of the NAND gate G1 is charged up to the potential $V_{DD}$ through the bipolar transistor Q21.

In this manner, the output XQ of the NAND gate G2 starts changing when the input A of the NAND gate G1 changes. It is particularly noted that in the above-mentioned operation, the output XQ starts changing in response to a change in the input A. Hence, a reduced time difference between the outputs Q and XQ can be obtained.

A description is given of a second preferred embodiment of the present invention. An essential feature of the second embodiment is that a flip-flop is constructed by a small number of elements, compared with the first embodiment. The flip-flop according to the second embodiment can operate faster than the flip-flop according to the first embodiment.

Figure 4:
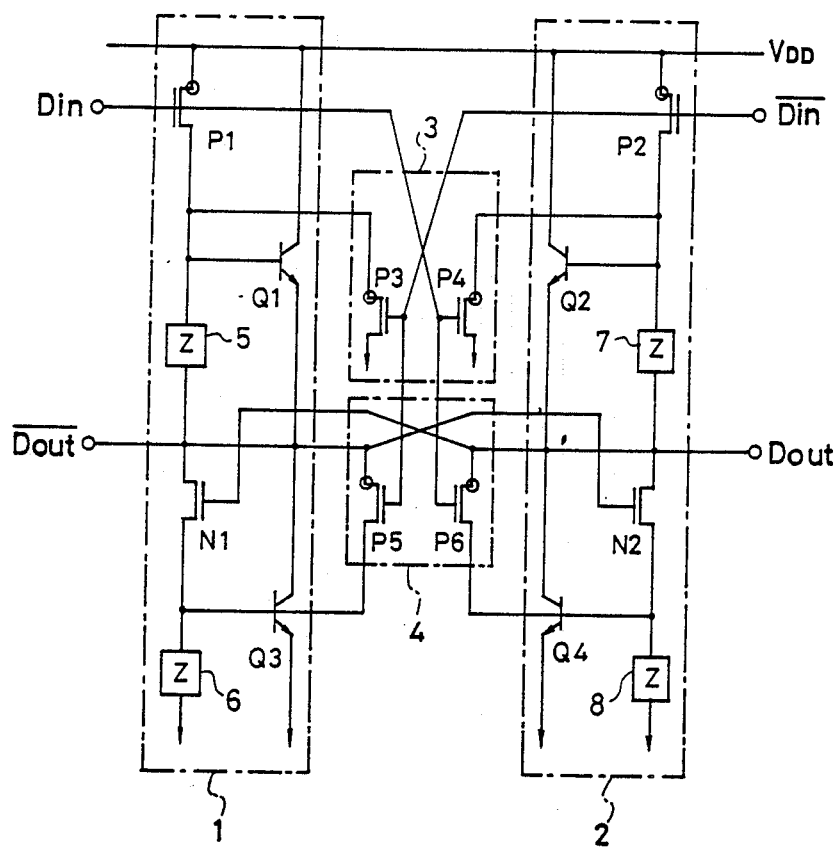
FIG. 4 is a circuit diagram of a second preferable embodiment of the present invention.

FIG. 4 is a circuit diagram of the second embodiment. As is illustrated, the second embodiment is formed by substituting the NAND gates G1 and G2 for Bi-CMOS type inverters 1 and 2, respectively. The base discharge circuit 3 and the base charge circuit 4 are the same as those shown in FIG. 3.

The inverter 1 includes an input circuit and an output circuit. The input circuit of the inverter 1 handles a logic operation of the inverter 1, and the output circuit thereof serves as a driver circuit. The input circuit is made up of a PMOS transistor P1, an NMOS transistor N1, and loads (impedance circuits) 5 and 6, all of which are connected in series as shown in FIG. 4. That is, the source of the PMOS transistor P1 is connected to the high-potential power source $V_{DDD}$, and the drain thereof is connected to one of the two ends of the load 5. The gate of the PMOS transistor P1 is supplied with an input Din (corresponding to the input A shown in FIG. 3). The other end of the load 5 is connected to the drain of the NMOS transistor N1, through which an output $\overline{\text{Dout}}$ (corresponding to the output XQ) is drawn. The source of the NMOS transistor N1 is connected to one of the two ends of the load 6, and the other end thereof is connected to the low-potential power source (not shown).

The output circuit of the inverter 1 is made up of two NPN bipolar transistors Q1 and Q3, which are connected in series. The collector of the bipolar transistor Q1 is connected to the high-potential power source $V_{DD}$, and the emitter thereof is connected to the collector of the bipolar transistor Q3. The base of the bipolar transistor Q1 is connected to the drain of the PMOS transistor P1. The base of the bipolar transistor Q3 is connected to the source of the NMOS transistor N1, and the emitter thereof is connected to the low-potential power source. The inverter 2 is formed in the same manner as the inverter 1. An input $\overline{\text{Din}}$ is supplied to the inverter 2, which provides an output Dout. The inputs Din and $\overline{\text{Din}}$ are complementary inputs, and the outputs Dout and $\overline{\text{Dout}}$ are complementary outputs. The inverter 2 is made up of a PMOS transistor P2, an NMOS transistor N2, two bipolar transistors Q2 and Q4, and two loads 7 and 8.

Figure 1:
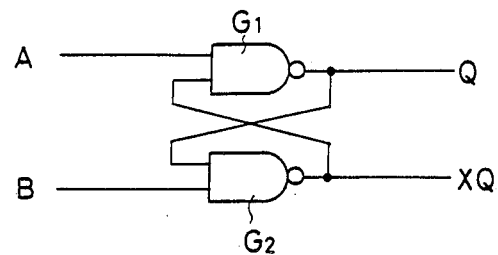
FIG. 1 is a circuit diagram of a conventional NAND gate type flip-flop.
Figures 5A, 5B:
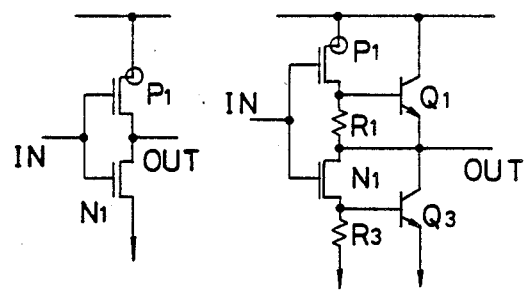
FIG. 5A is a circuit diagram of a CMOS inverter.
FIG. 5B is a circuit diagram of a Bi-CMOS type inverter.

Each of the Bi-CMOS type inverters 1 and 2 is further described with reference to FIGS. 5A and 5B. FIG. 5A is a circuit diagram of a CMOS inverter. The CMOS inverter consists of PMOS and NMOS transistors P1 and N1 connected in series. An input IN is supplied to the gates of the PMOS and NMOS transistors P1 and N1, and an output OUT is drawn from the mutually connected drains of the PMOS and NMOS transistors P1 and N1.

FIG. 5B a modified inverter formed by combining the CMOS inverter shown in FIG. 5A and bipolar transistors Q1 and Q3. Resistors R1 and R3 function to discharge the bases of the bipolar transistors Q1 and Q3, respectively. When the input IN is H, the PMOS and NMOS transistors P1 and N1 are OFF and ON, respectively, and the bipolar transistors Q1 and Q3 are OFF and ON, respectively. Thus, the output OUT is L. On the other hand, when the input IN is L, the PMOS and NMOS transistors P1 and N1 are ON and OFF, respectively, and the bipolar transistors Q1 and Q3 are ON and OFF, respectively. Thus, the output OUT is H.

Each of the inverters 1 and 2 is formed in a similar manner to the modified inverter shown in FIG. 5B. By cross-connecting the inverters of FIG. 5B, a flip-flop can be formed. The flip-flop thus configured is constructed by a smaller number of structural elements than a number of structural elements for a NAND gate type flip-flop or a NOR gate type flip-flop. Additionally, a capacitance coupled to the input of the Bi-CMOS inverter type flip-flop is smaller than those for the other type flip-flops. It is however noted that a conventional Bi-CMOS inverter type flip-flop presents a delay which occurs between the complementary outputs.

In order to overcome the disadvantage, the base discharge circuit 3 and the base charge circuit 4 are provided according to the second embodiment. The base discharge circuit 3 starts discharging the base of the bipolar transistor Q1 or Q2 in response to a change in the input Din or $\overline{\text{Din}}$. The base charge circuit 4 starts charging the base of the bipolar transistor Q3 or Q4 in response to a change in the input Din or $\overline{\text{Din}}$. The loads 5 to 8 may be formed by resistors or MOS transistors.

Figure 6:
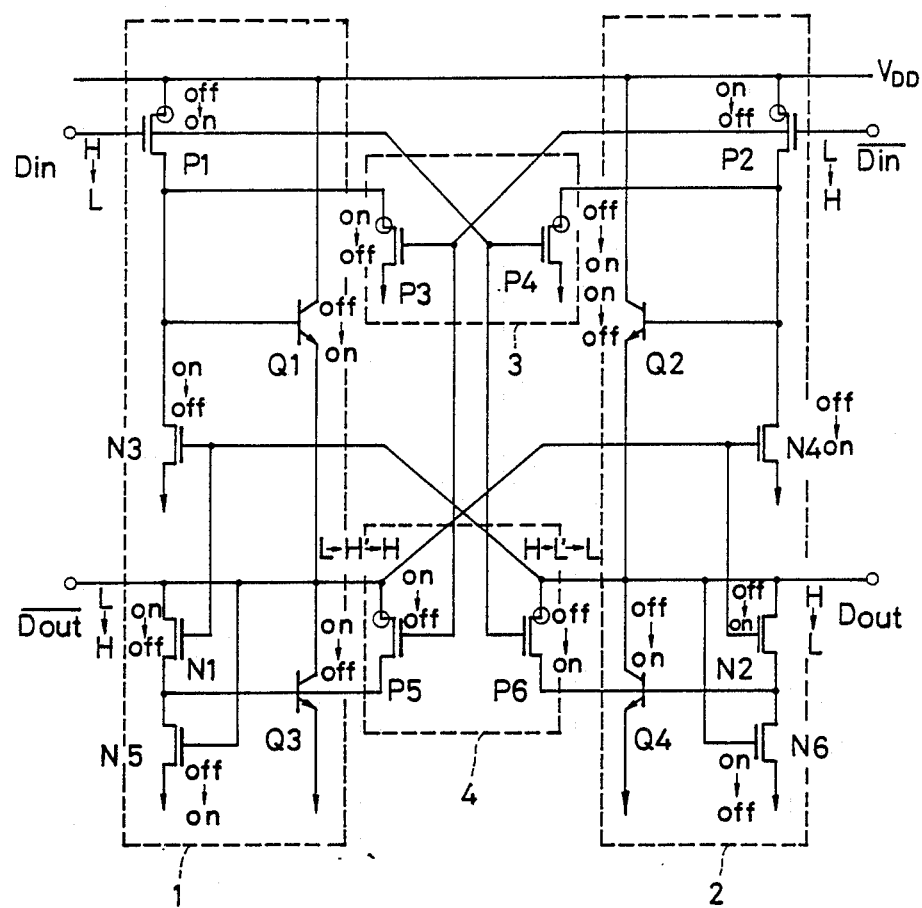
FIG. 6 is a circuit diagram of a configuration according to the second embodiment shown in FIG. 4.

FIG. 6 is a circuit diagram of a flip-flop formed by using NMOS transistors N3 to N6 to form the loads 5 to 8. The drains of the NMOS transistors N3 and N4 are connected to the drains of the PMOS transistors P1 and P2, respectively. The gates of the NMOS transistors N3 and N4 are connected to the outputs Dout and $\overline{\text{Dout}}$, respectively, and the sources thereof are connected to the low-potential power source. The drains of the NMOS transistors N5 and N6 are connected to the sources of the NMOS transistors N1 and N2, respectively. The source of the NMOS transistors N5 and N6 are connected to the low-potential power source. The gates of the NMOS transistors N5 and N6 are connected to the outputs $\overline{\text{Dout}}$ and Dout, respectively.

It is now assumed that the flip-flop shown in FIG. 6 is stable in the state where the inputs Din and $\overline{\text{Din}}$ are H and L, respectively, and the outputs Dout and $\overline{\text{Dout}}$ are H and L, respectively. In this state, the PMOS transistors P1, P4 and P6 are OFF, and the PMOS transistors P2, P3 and P5 are ON. Further, the NMOS transistors N1, N3 and N6 are ON and the NMOS transistors N2, N4 an N5 are OFF. The bipolar transistors Q1 and Q4 are OFF, and the bipolar transistors Q2 and Q3 are ON.

When the input $\overline{Din}$ changes from H to L and simultaneously the input Din changes from L to H, the PMOS transistors P1, P4 and P6 are turned ON, and the PMOS transistors P2, P3 and P5 are turned OFF. At this moment, the output Dout is still H and the output $\overline{Dout}$ is still L. Thus, the NMOS transistors N1, N3 and N6 are ON, and the NMOS transistors N2, N4 and N5 are OFF. As a result, the base potential of the bipolar transistor Q1 increases up to an intermediate potential based on ON resistances of the PMOS transistor P1 and the NMOS transistor N1. Thus, the bipolar transistor Q1 turns toward ON and passes a current based on the intermediate potential of the base thereof. Thereby, the output $\overline{Dout}$ increases up to an intermediate potential H'(L<H'<H) based on ON resistances of the bipolar transistors Q1 and Q3. Thereby, the NMOS transistors N2, N4 and N5 are switched to an ON state based on the intermediate potential H'. Thus, a charge at the base of the bipolar transistor Q3 starts passing through the NMOS transistor N5, so that the bipolar transistor Q3 starts turning OFF.

On the other hand, since the PMOS transistor P4 turns ON when the input Din changes from H to L, a charge at the base of the bipolar transistor Q2 is allowed to pass through the PMOS transistor P4. That is, the potential of the base of the bipolar transistor Q2 starts decreasing at the same time as the input Din changes from H to L. The bipolar transistor Q2 turns toward OFF. In addition to discharging of the base of the bipolar transistor Q2 through the PMOS transistor P4, the base of the bipolar transistor Q2 is discharged through the NMOS transistor N4 which is in the ON state based on the intermediate potential H,. Thereby, discharging of the base of the bipolar transistor Q2 is accelerated.

The PMOS transistor P6 turns ON at the same time as the input Din changes from H to L. Thereby, a charge at the output Dout is caused to pass through the PMOS transistor P6. At this time, the NMOS transistor N6 is ON. Therefore, the charge at the output Dout passes through the PMOS transistor P6 and then the NMOS transistor N6. Thus, the potential of the output Dout starts decreasing to become an intermediate potential L' (H<L'<L). Simultaneously, the bipolar transistor Q4 starts turning ON, and a part of the charge at the output Dout is allowed to pass through the bipolar transistor Q4.

The increasing intermediate potential H, of the output $\overline{Dout}$ is also applied to the gate of the NMOS transistor N2, which starts turning ON. Thus, a base current from the output Dout which is still H starts charging the base of the bipolar transistor Q4, so that the bipolar transistor Q4 is facilitated to turn ON. The decreasing intermediate potential L' of the output Dout is applied to the gate of the NMOS transistor N3. Thus, the bipolar transistor Q1 is facilitated to turn ON. That is, ON resistance of the bipolar transistor Q1 is further decreased, so that the output $\overline{Dout}$ further increases. Thereby, ON resistance of the NMOS transistor N2 is further reduced, so that the output Dout further decreases.

In the above-mentioned manner, the base discharge circuit 3 and the base charge circuit 4 cause changes in the outputs Dout and $\overline{Dout}$ at the same time as the levels of the inputs Din and $\overline{Din}$ change. Then, changes of the inverter 1 and 2 facilitate changes of the inverter 2 and 1, respectively. As a result, the outputs Dout and $\overline{Dout}$ are quickly stabilized and there is less time difference therebetween.

Figure 7:
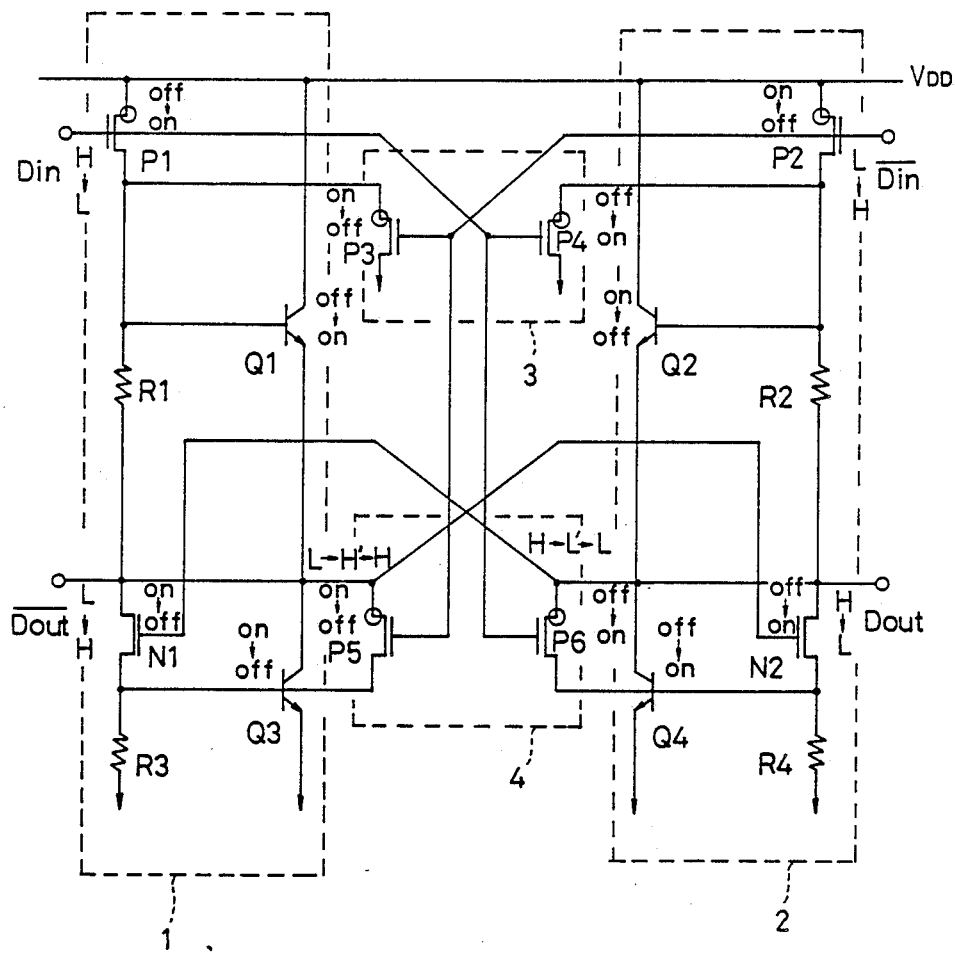
FIG. 7 is a circuit diagram of another configuration according to the second embodiment shown in FIG. 4.

FIG. 7 is a circuit diagram of a configuration for the second embodiment where the loads 5 to 8 are formed by resistors R1 through R4, respectively. The resistor R1 is connected between the base of the bipolar transistor Q1 and the output $\overline{Dout}$, and the resistor R2 is connected between the base of the bipolar transistor Q2 and the output Dout. The resistor R3 is connected between the source of the NMOS transistor N1 and the low-potential power source. The resistor R4 is connected between the source of the NMOS transistor N2 and the low-potential power source.

It is now assumed that the flip-flop shown in FIG. 7 is stable in the state where the inputs Din and $\overline{Din}$ are H and L, respectively and the outputs Dout and $\overline{Dout}$ are H and L, respectively. In this state, the PMOS transistors P1, P4 and P6 are OFF, and the PMOS transistors P2, P3 and P5 are ON. Further, the NMOS transistors N1 and N2 are ON and OFF, respectively. Moreover, the bipolar transistors Q1 and Q4 are OFF, and the bipolar transistors Q2 and Q3 are ON.

When the inputs Din and $\overline{Din}$ change to L and H, respectively, for example, the flip-flop operates as follows. At the same time as the inputs Din and $\overline{Din}$ change, the PMOS transistors P1, P4 and P6 turn ON, and the PMOS transistors P2, P3 and P5 turn OFF. At this moment, the output Dout is still H and the output $\overline{Dout}$ is still L. Therefore, the NMOS transistors N1 and N2 are ON and OFF, respectively. The base potential of the bipolar transistor Q1 increases up to an intermediate potential based on ON resistances of the PMOS transistor P1 and the resistance R1. Thus, the bipolar transistor Q1 starts turning ON and passes a current based on the intermediate potential of the base thereof. Thereby, the output $\overline{Dout}$ increases up to an intermediate potential H'(L<H'<H) based on ON resistances of the bipolar transistors Q1 and Q3. Thereby, the NMOS transistor N2 starts turning ON.

On the other hand, since the PMOS transistor P4 turns ON when the input Din changes from H to L, a charge at the base of the bipolar transistor Q2 is allowed to pass through the PMOS transistor P4. That is, the potential of the base of the bipolar transistor Q2 starts decreasing at the same time as the input Din changes from H to L. Then the bipolar transistor Q2 turns toward OFF. In addition to discharging of the base of the bipolar transistor Q2 through the PMOS transistor P4, the base of the bipolar transistor Q2 is discharged through the NMOS transistor N2 which is in an ON state based on the increasing intermediate potential H' at the output $\overline{Dout}$. Thereby, discharging of the base of the bipolar transistor Q2 is facilitated through the resistor R2, the NMOS transistor N2, and the resistor R4.

Before the NMOS transistor N2 turns ON, the PMOS transistor P6 turns ON at the same time as the input Din changes from H to L. Thereby, a charge at the output Dout is allowed to pass through the PMOS transistor P6 and the resistor R4. Thus, the potential of the output Dout starts decreasing to become an intermediate potential L'(H<L'<L). Simultaneously, the bipolar transistor Q4 starts turning ON, and a part of the charge at the output Dout is allowed to pass through the bipolar transistor Q4.

The decreasing intermediate potential L' of the output Dout is applied to the gate of the NMOS transistor N1, so that it starts turning OFF. Thereby, the NMOS transistor N1 stops supplying the bipolar transistor Q3 with a base current from the high-potential power source $V_{DD}$ through the PMOS transistor P1 and the resistor R1. On the other hand, a charge at the base of the bipolar transistor Q3 is drawn through the resistor R3. Hence, the bipolar transistor Q3 turns OFF, so that the potential of the output $\overline{Dout}$ further increases. The increased potential of the output $\overline{Dout}$ causes a further increase of the base potential of the bipolar transistor Q1. Thus, ON resistance of the bipolar transistor Q1 further decreases, and the potential of the output $\overline{Dout}$ further increases. Correspondingly, the potential of the output Dout further decreases. This causes a further decrease of the base potential of the bipolar transistor Q2. Thereby, ON resistance of the bipolar transistor Q2 is further increased, so that a decrease of the output Dout is facilitated. In this manner, the outputs Dout and $\overline{Dout}$ are inverted to L and H, respectively. In the above-mentioned manner, the outputs Dout and $\overline{Dout}$ start changing at the same time as the inputs Din and $\overline{Din}$ change, and less time difference between the outputs Dout and $\overline{Dout}$ occurs.

It is noted that the NMOS transistors N3 and N4 shown in FIG. 6 are connected to ground, and on the other hand, the resistors R1 and R2 are connected to the outputs Dout and $\overline{Dout}$, respectively. This is based on the difference between characteristics of transistors and resistors. In case where the resistors R1 and R2 are connected to ground, current flows to ground through the resistor R1 when the input Din changes from H to L. This is wasteful of power. This holds true for the resistor R2. On the other hand, when the input Din changes from H to L, the NMOS transistor N1 in the configuration shown in FIG. 7 turns OFF. Therefore, the current through the resistor R1 is inhibited from flowing to ground. This holds true for the inverter 2.

Figure 8:
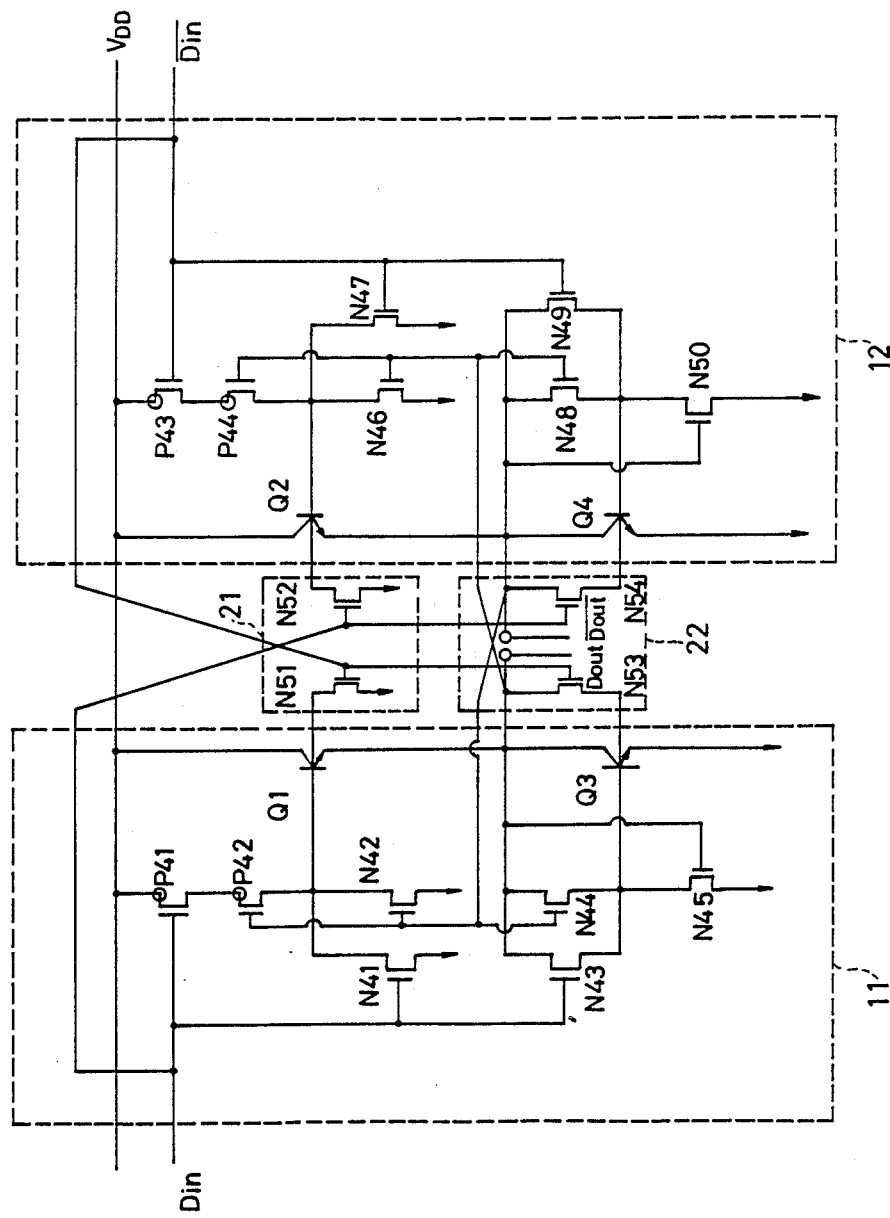
FIG. 8 is a third embodiment of the present invention.

A description is given of a third embodiment of the present invention with reference to FIG. 8. A flip-flop according to the third embodiment includes a base discharge circuit 21 and a base charge circuit 22, which cooperate with NOR gates 11 and 12. The NOR gate 11 is made up of PMOS transistors P41, P42, NMOS transistors N41 through N45, and NPN bipolar transistors Q1 and Q3. Similarly, the NOR gate 12 is made up of PMOS transistors P43, P44, NMOS transistors N46 through N50, and NPN bipolar transistors Q2 and Q4.

The base discharge circuit 21 is made up of two NMOS transistors N51 and N52. The gates of the NMOS transistors N51 and N52 are supplied with the inputs $\overline{Din}$ and Din, respectively, and the drains thereof are connected to the bases of the bipolar transistors Q1 and Q2, respectively. The sources of the NMOS transistors N51 and N52 are connected to the low-potential power source (ground). The base charge circuit 22 is made up of two NMOS transistors N53 and N54. The gates of the NMOS transistors N53 and N54 are supplied with the inputs $\overline{Din}$ and Din, respectively, and the sources thereof are connected to the bases of the bipolar transistors Q3 and Q4, respectively. The drains of the NMOS transistors N53 and N54 are connected to the collectors of the bipolar transistors Q3 and Q4, respectively. The drains of the NMOS transistors N53 and N54 are connected to the outputs of the NOR gates 12 and 11, respectively.

A NOR gate generates a high-level output Dout when both the inputs are L. Therefore, when the inputs Din and $\overline{Din}$ applied to the NOR gates 11 and 12 are L, the outputs Dout and $\overline{Dout}$ of the flip-flop are H and L, or L and H, respectively. The NMOS transistors N51 and N52 of the base discharge circuit 21 are made active when the inputs $\overline{Din}$ and Din change from L to H, respectively. The NMO transistors N53 and N54 of the base charge circuit 22 are made active when the inputs $\overline{Din}$ and Din change from L to H.

A description is given of an application of flip-flops according to the present invention.

Figure 9:
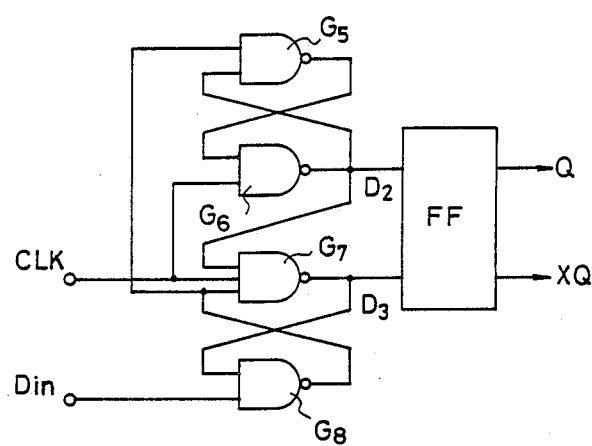
FIG. 9 is a circuit diagram of an application of the present invention.
Figure 10:
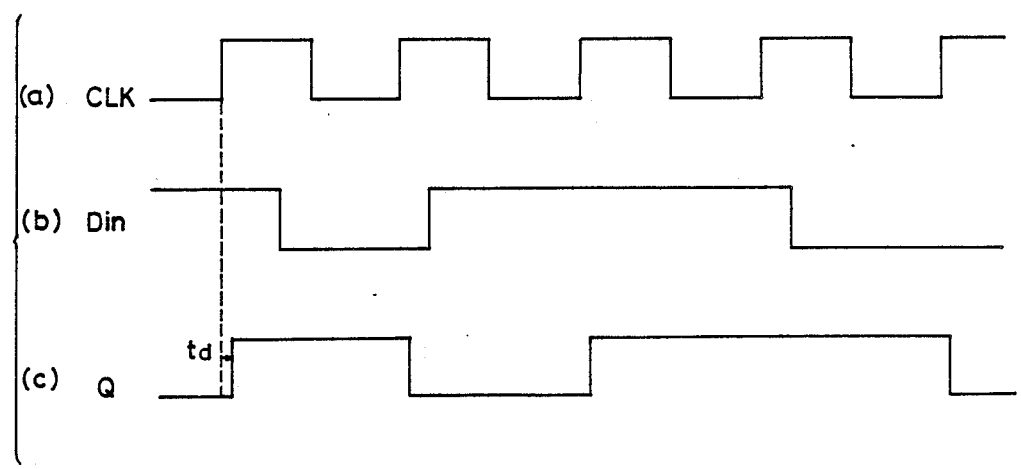
FIG. 10(a-c) is a timing chart of signals observed at different points of the circuit shown in FIG. 9.

Referring to FIG. 9, there is shown an edge trigger type register, which is made up of NAND gates G5 to G8, and a flip-flop FF formed according to the present invention. The input Din is applied to the NAND gate G8, and a clock pulse CLK is supplied to the NAND gates G6 and G7. An example of the clock pulse CLK and the input Din is shown in FIG. 10. When the clock pulse CLK is L, outputs D2 and D3 of the gates G6 and G7 are H. At this time, the input Din is H/L (high or low), the output of the NAND gate G8 is L/H, and the output of the NAND gate G5 is H/L. When the clock pulse CLK changes from L to H, the output D2 of the gate G6 is L/H, and the output D3 of the NAND gate G7 is H/L. Thus, the flip-flop FF operates as indicated by the following table.

TABLE

| D2 | D3 | Q | XQ |
|---|---|---|---|
| H | H | no change | |
| H | L | L | H |
| L | H | H | L |

As shown in FIG. 10(c), the output Q is delayed by a time $t_d$ from the clock pulse CLK shown in FIG. 10(a).

Figure 11:
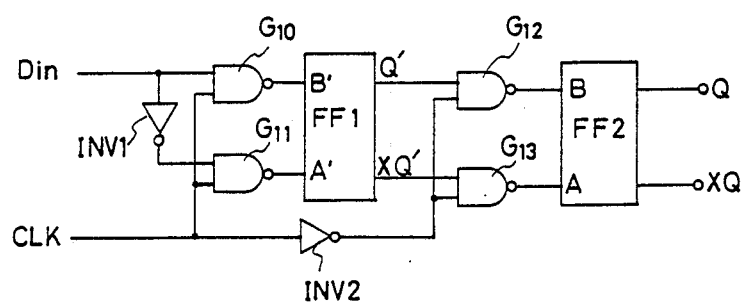
FIG. 11 is a circuit diagram of another application of the present invention.

FIG. 11 is a circuit diagram of another application of the present invention. The illustrated circuit is a master-slave type register. Two flip-flops FF1 and FF2 are formed according to the present invention. The master-slave type register includes four NAND gates G10 to G13 and two inverters INV1 and INV2. The clock pulse CLK is supplied to the NAND gates G10 and G11, and is supplied to the NAND gates G12 and G13 through the inverter INV2. The input Din is supplied to the NAND gate G10, and is supplied to the NAND gate G11 through the inverter INV1. The outputs of the NAND gates G10 and G11 are connected to inputs B' and A' of the flip-flop FFI, respectively. Outputs Q' and XQ' of the flip-flop are connected to the NAND gates G12 and G13, respectively. The outputs of the NAND gates G12 and G13 are connected to inputs B and A of the flip-flop FF2, which has outputs Q and XQ.

Figure 12:
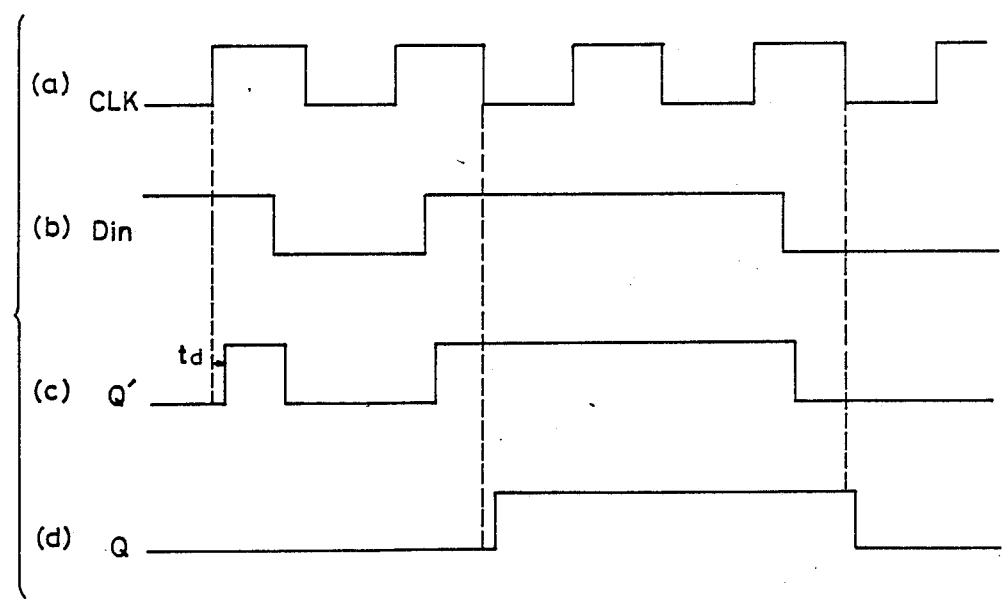
FIG. 12(a-d) is a timing chart of signals observed at different points of the circuit shown in FIG. 10.

FIG. 12 is a timing chart of signals at different points of the master-slave type register shown in FIG. 11.

The present invention is not limited to the aforementioned embodiments, and variations and modifications may be made without departing from the scope of the present invention.

What is claimed is:
1. An integrated circuit comprising:
   (A) first gate means for inputting first and second inputs and generating a first output indicative of a first logic operation result of said first gate means, said first gate means having a first output terminal for passing said first output;
2. An integrated circuit as claimed in claim 1, wherein:
   said discharge means includes a first P-channel MOS (PMOS) transistor having a gate, a source and a drain, the gate of said first PMOS transistor receives said third input, the source thereof is connected to the base of said first bipolar transistor provided in said first bipolar transistor means, and the drain thereof is set to a predetermined potential, said discharge means includes a second PMOS transistor having a gate, a source and a drain, the gate of said second PMOS transistor receives said first input, the source thereof is connected to the base of the third bipolar transistor provided in said second bipolar transistor means, and the drain thereof is set to said predetermined potential.

3. An integrated circuit as claimed in claim 1, wherein:

said charge means includes a first P-channel MOS (PMOS) transistor having a gate, a source and a drain, the gate of said first PMOS transistor receives said third input, the source thereof is connected to said first output terminal, and the drain thereof is connected to the base of said second bipolar transistor provided in said first bipolar transistor means, said charge means includes a second PMOS transistor having a gate, a source and a drain, the gate of said second PMOS transistor receives said first input, the source thereof is connected to said second output terminal, and the drain thereof is connected to the base of the fourth bipolar transistor provided in said second bipolar transistor means.

4. An integrated circuit as claimed in claim 1, wherein:

said discharge means includes a first N-channel MOS (NMOS) transistor having a gate, a source and a drain, the gate of said first NMOS transistor receives said third input, the drain thereof is connected to the base of said first bipolar transistor provided in said first bipolar transistor means, and the source thereof is set to a predetermined potential, said discharge means includes a second NMOS transistor having a gate, a source and a drain, the gate of said second NMOS transistor receives said first input, the drain thereof is connected to the base of the third bipolar transistor provided in said second bipolar transistor means, and the source thereof is set to said predetermined potential.

5. An integrated circuit as claimed in claim 1, wherein:

said charge means includes a first N-channel MOS (NMOS) transistor having a gate, a source and a drain, the gate of said first NMOS transistor receives said third input, the drain thereof is connected to said first output terminal, and the source thereof is connected to the base of said second bipolar transistor provided in said first bipolar transistor means, said charge means includes a second NMOS transistor having a gate, a source and a drain, the gate of said second NMOS transistor receives said first input, the drain thereof is connected to said second output terminal, and the source thereof is connected to the base of the fourth bipolar transistor provided in said second bipolar transistor means.

6. An integrated circuit as claimed in claim 1, wherein each of said first and second gate means is a NAND gate.

7. An integrated circuit as claimed in claim 1, wherein each of said first and second gate means is an inverter.

8. An integrated circuit as claimed in claim 1, wherein each of said first and second gate means is a NOR gate.

9. An integrated circuit as claimed in claim 1, wherein said first and second bipolar transistors are connected in series between a first power source and a second power source.

10. An integrated circuit as claimed in claim 1, wherein said third and fourth bipolar transistors are connected in series between a first power source and a second power source.

11. An integrated circuit as claimed in claim 1, wherein said first gate means includes first and second loads coupled to the bases of said first and second bipolar transistors, respectively, and wherein said second gate means includes third and fourth loads coupled to the base of said third and fourth bipolar transistors, respectively.

12. An integrated circuit as claimed in claim 11, wherein each of said first, second, third and fourth loads includes a resistor.

13. An integrated circuit as claimed in claim 11, wherein each of said first, second, third and fourth loads includes an N-channel MOS transistor.

14. An integrated circuit as claimed in claim 1, wherein said integrated circuit is a flip-flop.

15. An integrated circuit coupled to receive first and second inputs, comprising:

a first gate circuit coupled to receive the first input and a third input, and having a first output terminal for providing a first output, said first gate circuit including:

a first CMOS circuit for receiving the first and third inputs and for generating a first logic operation result; and a first bipolar transistor circuit, coupled to said first CMOS circuit and said first output terminal, for receiving the first logic operation result and for generating the first output, said first bipolar transistor circuit including a first bipolar transistor for charging the first output terminal, and a second bipolar transistor for discharging the first output terminal;

a second gate circuit coupled to receive the third input, and coupled to said first gate circuit so as to receive the first output as a fourth input, said second gate circuit having a second output terminal for providing a second output which is the third input to said first gate circuit, said second gate circuit including:

a second CMOS circuit for receiving the second and fourth inputs and for generating a second logic operation result; and a second bipolar transistor circuit, coupled to said second CMOS circuit and said second output terminal, for generating the second output based on the second logic operation result, said second bipolar transistor circuit including a third bipolar transistor for charging the second output terminal and a fourth bipolar transistor for discharging the second output terminal;

a discharge circuit, coupled to said first and third bipolar transistors and coupled to receive the first and second outputs, for discharging a base of said first bipolar transistor in response to a change in said second input and for discharging a base of said third bipolar transistor in response to a change in the first input; and a charge circuit, coupled to said second and fourth bipolar transistors and coupled to receive the first and second inputs, for changing a base of said second bipolar transistor in response to the change in the second input and for charging a base of said fourth bipolar transistor in response to the change in the first input.

* * * * *

UNITED STATES PATENT AND TRADEMARK OFFICE
CERTIFICATE OF CORRECTION

PATENT NO. : 4,972,096

DATED : NOVEMBER 20, 1990

INVENTOR(S) : TOHRU TAKESHIMA ET AL.

It is certified that error appears in the above-identified patent and that said Letters Patent is hereby corrected as shown below:

Col. 5, line 46, "$V_{DDD}$" should be --$V_{DD}$--.

Col. 7, line 50, "H," should be --H'--.

Col. 10, (claim 1), line 63, after "output;", insert the remaining part of claim 1, which was inadvertently omitted from the patent:

--A1) said first gate means including first CMOS means for receiving said first and second inputs and generating said first logic operation result, and A2) first bipolar transistor means for generating said first output from said first logic operation result, said first bipolar transistor means including a first bipolar transistor for charging said first output terminal, and a second bipolar transistor for discharging said first output terminal;

B) second gate means for inputting third and fourth inputs and generating a second output indicative of a second logic operation result of said second gate means, said second gate means having a second output terminal for passing said second output;

UNITED STATES PATENT AND TRADEMARK OFFICE
CERTIFICATE OF CORRECTION

PATENT NO. : 4,972,096

DATED : NOVEMBER 20, 1990

INVENTOR(S) : TOHRU TAKESHIMA ET AL.

It is certified that error appears in the above-identified patent and that said Letters Patent is hereby corrected as shown below:

B1) said second gate means including second CMOS means for receiving said third and fourth inputs and generating said second logic operation result, and B2) second bipolar transistor means for generating said second output from said second logic operation result, said second bipolar transistor means including a third bipolar transistor for charging said second output terminal, and a fourth bipolar transistor for discharging said second output terminal, said first and third inputs being complementary inputs, said first output serving as said fourth input, said second output serving as said second input, said first and second outputs being complementary outputs, C) discharge means for discharging a base of said first bipolar transistor of said first bipolar transistor means in response to a change in said third input and for discharging a base of said third bipolar transistor of said second bipolar transistor means in response to a change in said first input; and

UNITED STATES PATENT AND TRADEMARK OFFICE
CERTIFICATE OF CORRECTION

PATENT NO. : 4,972,096      Page 3 of 3

DATED : NOVEMBER 20, 1990

INVENTOR(S) : TOHRU TAKESHIMA ET AL.

It is certified that error appears in the above-identified patent and that said Letters Patent is hereby corrected as shown below:

```
       D)  charge means for charging a
base of said second bipolar transistor
of said first bipolar transistor means
in response to said change in said third
input and for charging a base of said
fourth bipolar transistor of said second
bipolar transistor means in response to
said change in said first input.--.
```

Signed and Sealed this

Twenty-first Day of April, 1992

Attest:

HARRY F. MANBECK, JR.

Attesting Officer      Commissioner of Patents and Trademarks

UNITED STATES PATENT AND TRADEMARK OFFICE
CERTIFICATE OF CORRECTION

PATENT NO. : 4,972,096
DATED : NOVEMBER 20, 1990
INVENTOR(S) : TOHRU TAKESHIMA ET AL.

It is certified that error appears in the above-identified patent and that said Letters Patent is hereby corrected as shown below:

TITLE PAGE, [73] "Assignee: Fujitsu Limited, Kawasaki, Japan" should be

--Assignee: Fujitsu Limited, Kawasaki, Japan and Fujitsu VLSI Limited, Kasugai, Japan--.

Signed and Sealed this

Sixth Day of October, 1992

*Attest:*

DOUGLAS B. COMER

*Attesting Officer*     *Acting Commissioner of Patents and Trademarks*